(12) United States Patent
Daley et al.

(10) Patent No.: US 7,579,615 B2
(45) Date of Patent: Aug. 25, 2009

(54) ACCESS TRANSISTOR FOR MEMORY DEVICE

(75) Inventors: Jon Daley, Boise, ID (US); Kristy A. Campbell, Boise, ID (US); Joseph F. Brooks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 11/199,251

(22) Filed: Aug. 9, 2005

(65) Prior Publication Data

US 2007/0034921 A1 Feb. 15, 2007

(51) Int. Cl.
*H01L 45/00* (2006.01)
(52) U.S. Cl. .................. 257/5; 257/E45.002; 365/163
(58) Field of Classification Search ................. 365/163; 257/1, 2, 3, 4, 5, E45.002
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |

(Continued)

FOREIGN PATENT DOCUMENTS

JP 5-6126916 10/1981

(Continued)

OTHER PUBLICATIONS

U.S. Appl. No. 10/916,421, filed Aug. 2004, Campbell.

(Continued)

*Primary Examiner*—Anh Phung
*Assistant Examiner*—Michael Lulis
(74) *Attorney, Agent, or Firm*—Dickstein Shapiro LLP

(57) ABSTRACT

An access transistor for a resistance variable memory element and methods of forming the same are provided. The access transistor has first and second source/drain regions and a channel region vertically stacked over the substrate. The access transistor is associated with at least one resistance variable memory element.

13 Claims, 6 Drawing Sheets

U.S. PATENT DOCUMENTS

| | | |
|---|---|---|
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2001/0001722 A1 | 5/2001 | Forbes et al. |
| 2002/0000666 A1 | 1/2002 | Kozicki et al. |
| 2002/0072188 A1 | 6/2002 | Gilton |

| | | | |
|---|---|---|---|
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0156468 A1* | 8/2003 | Campbell et al. | 365/200 |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |
| 2004/0038480 A1* | 2/2004 | Moore et al. | 438/257 |
| 2004/0041188 A1* | 3/2004 | Bissey et al. | 257/297 |
| 2004/0041189 A1* | 3/2004 | Voshell et al. | 257/297 |
| 2005/0009225 A1* | 1/2005 | Mitzi et al. | 438/59 |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

U.S. Appl. No. 10/893,299, filed Jul. 2004, Campbell.
Abdel-All, A.; Elshafie, A.; Elhawary, M.M., DC Electric-field Effect in Bulk and Thin-film Ge5As38Te57 Chalcogenide Glass, Vacuum 59 (2000) 845-853.
Adler, D.; Moss, S.C., Amorphous Memories and Bistable Switches, J. Vac. Sci. Technol. 9 (1972) 1182-1189.
Adler, D.; Henisch, H.K.; Mott, S.N., The Mechanism of Threshold Switching in Amorphous Alloys, Rev. Mod. Phys. 50 (1978) 209-220.
Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.
Afifi, M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.
Alexperova, Sh.M.; Gadzhieva, G.S., Current-voltage Characteristics of Ag2Se Single Crystal Near the Phase Transition, Inorganic Materials 23 (1987) 137-139.
Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.
Angell, C.A., Mobile Ions in Amorphous Solids, Annu. Rev. Phys. Chem. 43 (1992) 693-717.
Aniya, M., Average Electronegativity, Medium-range-order, and Ionic Conductivity in Superionic Glasses, Solid State Ionics 136-137 (2000) 1085-1089.
Asahara, Y.; Izumitani, T., Voltage Controlled Switching in Cu-As-Se Compositions, J. Non-Cryst. Solids 11 (1972) 97-104.
Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.
Axon Technologies Corporation, Technology Description: *Programmable Metalization Cell (PMC)*, pp. 1-6 (pre-May 2000).
Baranovskii, S.D.; Cordes, H., On the Conduction Mechanism in Ionic Glasses, J. Chem. Phys. 111 (1999) 7546-7557.
Belin, R.; Taillades, G.; Pradel, A.; Ribes, M., Ion Dynamics in Superionic Chalcogenide Glasses: Complete Conductivity Spectra, Solid State Ionics 136-137 (2000) 1025-1029.
Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.
Benmore, C.J.; Salmon, P.S., Structure of Fast Ion Conducting and Semiconducting Glassy Chalcogenide Alloys, Phys. Rev. Lett. 73 (1994) 264-267.
Bernede, J.C., Influence Du Metal Des Electrodes Sur Les Caracteristiques Courant-tension Des Structures M-Ag2Se-M, Thin Solid Films 70 (1980) L1-L4.
Bernede, J.C., Polarized Memory Switching in MIS Thin Films, Thin Solid Films 81 (1981) 155-160.
Bernede, J.C., Switching and Silver Movements in Ag2Se Thin Films, Phys. Stat. Sol. (a) 57 (1980) K101-K104.
Bernede, J.C.; Abachi, T., Differential Negative Resistance in Metal/insulator/metal Structures with an Upper Bilayer Electrode, Thin Solid Films 131 (1985) L61-L64.
Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.
Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.
Bondarev, V.N.; Pikhitsa, P.V., A Dendrite Model of Current Instability in RbAg4I5, Solid State Ionics 70/71 (1994) 72-76.
Boolchand, P., The Maximum in Glass Transition Temperature (Tg) Near x=1/3 in GexSe1-x Glasses, Asian Journal of Physics (2000) 9, 709-72.
Boolchand, P.; Bresser, W.J., Mobile Silver Ions and Glass Formation in Solid Electrolytes, Nature 410 (2001) 1070-1073.
Boolchand, P.; Georgiev, D.G.; Goodman, B., Discovery of the Intermediate Phase in Chalcogenide Glasses, J. Optoelectronics and Advanced Materials, 3 (2001), 703.
Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.
Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.
Boolchand, P.; Grothaus, J.; Bresser, W.J.; Suranyi, P., Structural Origin of Broken Chemical Order in a GeSe2 glass, Phys. Rev. B 25 (1982) 2975-2978.
Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17$^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1−x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1−x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80−x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold In Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects In Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1−x Around the Stiffness Threshold Composition, J. Optoelectronics and Advanced Materials 3 (2001) 199-214.

Hu, J.; A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masul, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3-Ag2S, GeS2-GeS-Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1−x (0<=x<=0.571) Glasses, Solid State Ionics 123 (1999) 259-269.

Kluge, G.; Thomas, A.; Klabes, R.; Grotzschel, R., Suptitz, P. Silver Photodiffusion In Amorphous GexSe100−x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andrelchin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag In GexSe1−x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1−x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1−x Amorphous Thin Films, Jap. J. App. Phys. 15 (1976) 849-853.

Narayanan, R.A.; Asokan, S.; Kumar, A., Evidence Concerning the Effect of Topology on Electrical Switching In Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{o.15}Se_{0.85-x}Ag_x$ ($0 \leqq x \leqq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell, A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G. ;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects In Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1−x and AsxSe1−x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H. ;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2. 4), J. Non-Cryst. Solids 151 (1992) 149-154.

* cited by examiner

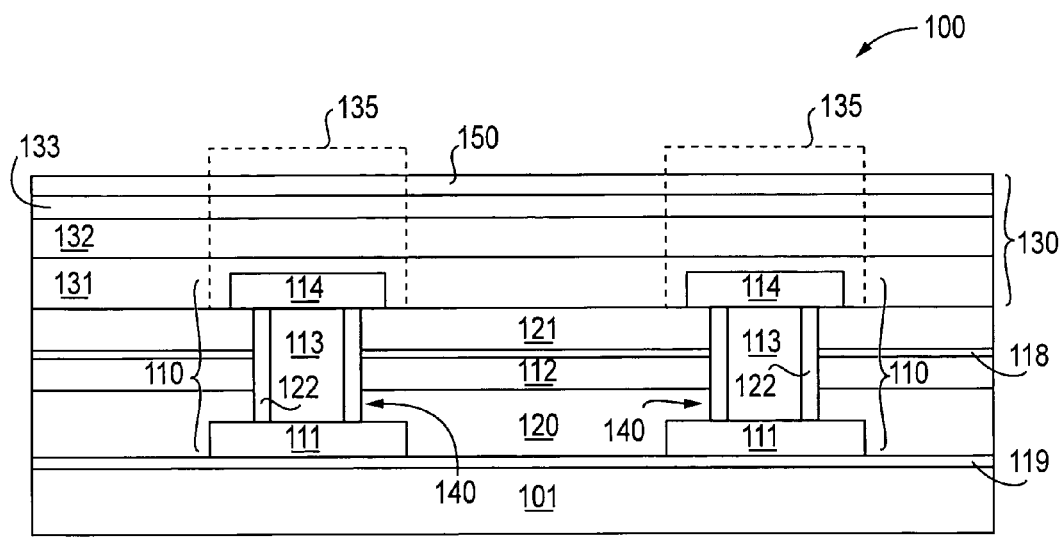
FIG. 2A
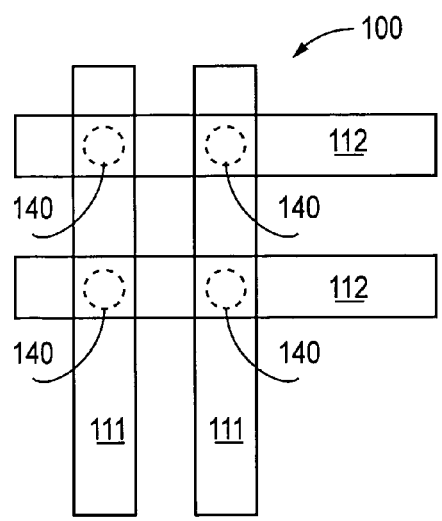　　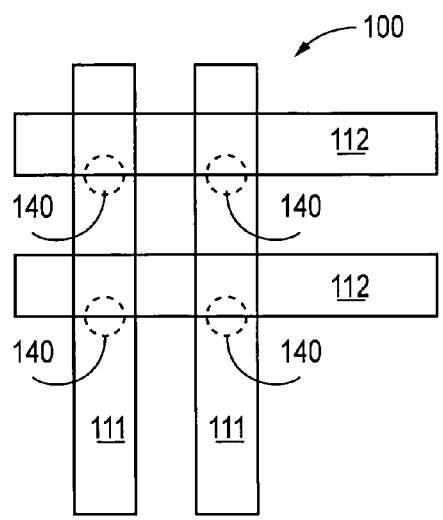
FIG. 2B　　　　　　　　FIG. 2C

ACCESS TRANSISTOR FOR MEMORY DEVICE

FIELD OF THE INVENTION

The invention relates to the field of random access memory (RAM) devices formed using a resistance variable material.

BACKGROUND OF THE INVENTION

Resistance variable memory elements, which include memory elements using chalcogenide glasses, have been investigated for suitability as semi-volatile and non-volatile random access memory devices. An exemplary chalcogenide resistance variable memory element is disclosed in U.S. Pat. No. 6,867,064 to Campbell et al.

In a typical chalcogenide resistance variable memory element, a conductive material, for example, silver or copper, is incorporated into a chalcogenide glass. The resistance of the chalcogenide glass can be programmed to stable higher resistance and lower resistance states. An unprogrammed chalcogenide variable resistance memory element is normally in a higher resistance state. A write operation programs the element to a lower resistance state by applying a voltage potential across the chalcogenide glass and forming a conductive pathway therein. The element may then be read by applying a voltage pulse of a lesser magnitude than the magnitude required to program the element; the resistance across the memory device is then sensed as higher or lower to define two logic states.

The programmed lower resistance state of a chalcogenide variable resistance element can remain intact for an indefinite period, typically ranging from hours to weeks, after the voltage potentials are removed; however, some refreshing may be useful. The element can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such an element can function as a semi- or non-volatile variable resistance memory having at least two resistance states, which can define two respective logic states, i.e., at least a bit of data.

FIG. 1 illustrates an exemplary construction of a resistance variable memory element 10 and an access transistor 83, as described in U.S. Pat. No. 6,867,064. The memory element 10 is fabricated over a semiconductor substrate 62 and comprises a first insulating layer 60 formed over the substrate 62. The insulating layer 60 contains a conductive plug 61. A first metal electrode 52 is formed within a second insulating layer 53 provided over the insulating layer 60 and plug 61. A third insulating layer 68 is formed over the first electrode 52 and second insulating layer 53. A chalcogenide glass layer 58 is within the third insulating layer 68. A metal, such as silver, is incorporated into the chalcogenide glass layer 58.

As shown in FIG. 1, the first electrode 52 is electrically connected to a source/drain region 81 of an access transistor 83, which is fabricated within and on the substrate 62. Another source/drain region 85 is connected by a bit line plug 87 to a bit line of a memory array. For purposes of clarity, the bit lines and word lines are not shown in FIG. 1. The gate of the transistor 83 is part of a word line which is connected to a plurality of resistance variable memory elements just as a bit line (not shown) may be coupled to a plurality of resistance variable memory elements through respective access transistors. The bit line may be formed over a fourth insulating layer (not shown) and connects to the bit line plug 87, which in turn connects to access transistor 83 as described above.

One of the limiting factors in increasing the density of a memory device array is the amount of substrate 62 surface area used to form each memory element 10 and associated devices, such as the access transistor 83. In the industry terminology, the surface area required for a memory cell is characterized in terms of the minimum feature size "F" that is obtainable by the lithography technology used to form the memory cell. As shown in FIG. 1, the conventional memory element 10 is laid out with an access transistor 83 that includes first and second source/drain regions 83, 85 that are disposed horizontally along the substrate 62 surface. When isolation between adjacent transistors is considered, the surface area required for such a transistor is generally $8F^2$ or $6F^2$.

Accordingly, there is a need in the art for resistance variable memory devices having more efficient use of substrate surface.

BRIEF SUMMARY OF THE INVENTION

Embodiments of the invention include an access transistor for a resistance variable memory element and methods of forming the same. The access transistor has first and second source/drain regions and a channel region vertically stacked over the substrate. The access transistor is associated with and located below at least one resistance variable memory element.

BRIEF DESCRIPTION OF THE DRAWINGS

The foregoing and other advantages and features of the invention will become more apparent from the detailed description of exemplary embodiments provided below with reference to the accompanying drawings in which:

FIG. 2A illustrates a portion of a memory array including an access transistor according to an exemplary embodiment of the invention;

FIGS. 2B and 2C are top down views of the array of FIG. 2A;

DETAILED DESCRIPTION OF THE INVENTION

Figure 1:
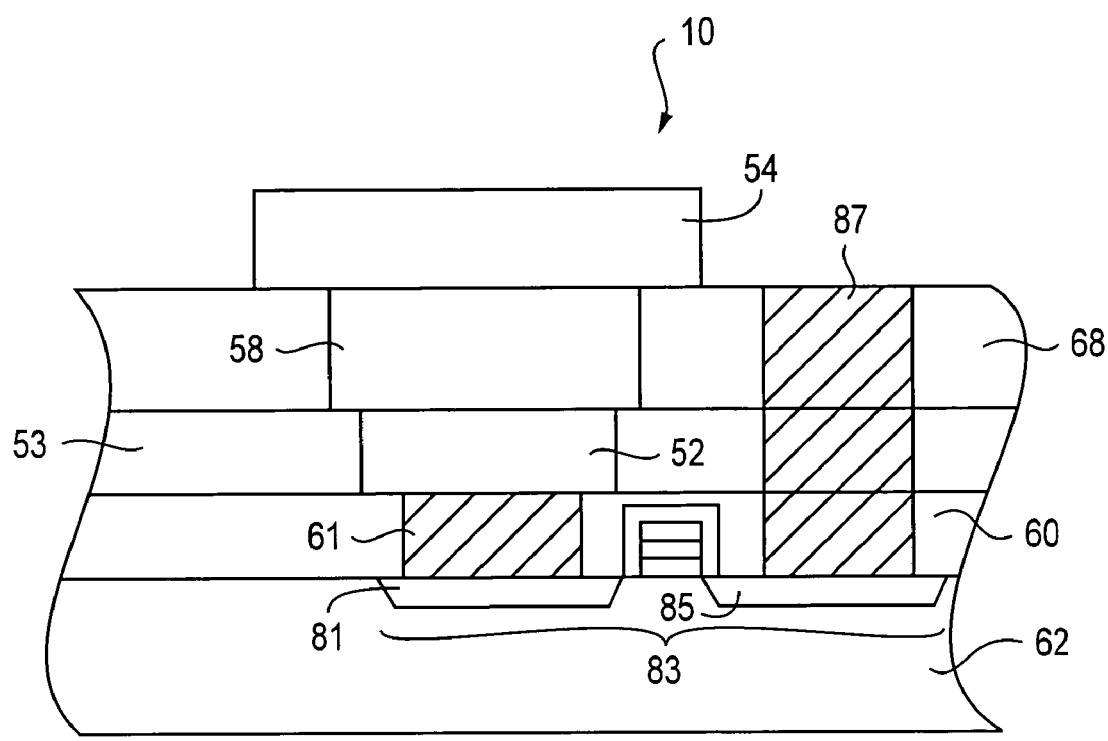
FIG. 1 depicts a resistance variable memory element and access transistor.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The invention is now explained with reference to the figures, which illustrate exemplary embodiments and throughout which like reference numbers indicate like features. FIG. 2A depicts a portion of a memory array 100 according to an exemplary embodiment of the invention. Specifically, FIG. 2A shows two memory elements 135, each memory element 135 being associated with a respective access transistor 110. Each memory element 135 is at least over at least a portion of the respective access transistor 135. The memory elements 135 and access transistors 110 are supported by a substrate 101. It should be understood, however, that the array 100 can include additional memory elements 135 each electrically connected to at least one access transistor 110.

Over the substrate 101 is a first dielectric region 119. Digit lines 111 are formed over the first dielectric region 119. The digit lines 111 are, for example, tungsten, but other conductive materials can be used. One or more dielectric layers form a second dielectric region 120 over and on lateral sides of the digit lines 111. Word lines 112 (see also FIGS. 2B and 2C) overlie the second dielectric region 120. Like the digit lines 111, the word lines 112 may be formed of tungsten, but other conductive materials can be used. There is an insulating layer 118 over and in contact with each word lines 112. A third dielectric region 121 having one or more dielectric layers is over the word lines 112 and insulating layers 118.

A via 140 extends through each word line and the second and third dielectric regions. The sidewalls of each via 140 are lined with a dielectric layer 122. A semi-conductive material 113 fills the vias 140. The semi-conductive material 113 is, for example, tin selenide, but other conductive materials can be used. A conductive capping layer 114 is over each via 140, semi-conductive material 113 and insulating liner 122.

FIGS. 2B and 2C are top down views of a portion of the array 100. As shown in FIGS. 2B and 2C, the digit lines 111 and word lines 112 are substantially perpendicular or orthogonal to one another. Each via 140 extends through a portion of a word line 112 to a digit line 111. As shown in FIG. 2B, the vias 140 can be surrounded by a word line 112. Alternatively, as illustrated in FIG. 2C, the vias 140 can be located at a lateral edge of a word line 112. When the vias 140 disrupt less of the word lines 112, as in FIG. 2C, the resistance of the word lines 112 is improved as compared to the embodiment of FIG. 2B.

Each access transistor 110 includes a digit line 111, word line 112, capping layer 114 and semi-conductive material 113. The digit line 111 and capping layer 114 serve as first and second source/drain regions of the access transistor 110, respectively. The semi-conductive material 113 forms the channel region of the access transistor 110.

The memory elements 135 also include one or more layers of resistance variable material, and may also include other materials layers. In the illustrated embodiment, the memory elements 135 include a stack 130 of layers 131, 132, 133. The stack 130 is formed over the capping layers 114 and third dielectric region 121.

In the exemplary embodiment shown in FIG. 2A, the memory cell stack 130 includes, for example, a chalcogenide material layer 131, a tin-chalcogenide layer 132, and an optional metal layer 133. The invention, however, is not limited to such embodiments, and the stack 130 can include additional or fewer layers of other materials suitable for forming a resistance variable memory element. For example, the stack 130 can include a second chalcogenide material layer (not shown) over the metal layer 133. The second chalcogenide layer may be a same material as the chalcogenide layer 131 or a different material.

In the illustrated embodiments, the chalcogenide material layer 131 is e.g., germanium selenide ($Ge_xSe_{100-x}$). The germanium selenide may be within a stoichiometric range of about $Ge_{33}Se_{67}$ to about $Ge_{60}Se_{40}$. The chalcogenide material layer 131 may be between about 100 Å and about 1000 Å thick, e.g., about 300 Å thick. Layer 131 need not be a single layer, but may also be comprised of multiple chalcogenide sub-layers having the same or different stoichiometries. The chalcogenide material layer 131 is in electrical contact with the capping layers 114.

Over the chalcogenide material layer 131 is an optional layer of metal-chalcogenide 132, such as tin-chalcogenide (e.g., tin selenide ($Sn_{1+/-x}Se$, where x is between about 1 and about 0)), or silver-chalcogenide (e.g., silver selenide). It is also possible that other chalcogenide materials may be substituted for selenium, such as sulfur, oxygen, or tellurium. The layer 132 in the exemplary embodiment is a layer of tin-chalcogenide layer and may be about 100 Å to about 400 Å thick; however, its thickness depends, in part, on the thickness of the underlying chalcogenide material layer 131. The ratio of the thickness of the tin-chalcogenide layer 132 to that of the underlying chalcogenide material layer 131 may be between about 5:1 and about 1:3.

An optional metal layer 133 is provided over the tin-chalcogenide layer 132, with silver (Ag) being the exemplary metal. This metal layer 133 is between about 300 Å and about 500 Å thick.

Although in the illustrated exemplary embodiments of the invention, stack 130 is shown including layers 131, 132, 133, it should be appreciated that one or more of layers 131,132, 133 may be excluded and other layers may be included. Non limiting examples of materials and layers that can be included in stack 130 and materials for electrode 114 are discussed in various patents and patent applications assigned to Micron Technology, Inc., including, but not limited to the following: U.S. patent application Ser. No. 10/765,393; U.S. patent application Ser. No. 09/853,233; U.S. patent application Ser. No. 10/022,722; U.S. patent application Ser. No. 10/663,741; U.S. patent application Ser. No. 09/988,984; U.S. patent application Ser. No. 10/121,790; U.S. patent application Ser. No. 09/941,544; U.S. patent application Ser. No. 10/193,529; U.S. patent application Ser. No. 10/100,450; U.S. patent application Ser. No. 10/231,779; U.S. patent application Ser. No. 10/893,299; U.S. patent Ser. No. 10/077,872; U.S. patent application Ser. No. 10/865,903; U.S. patent application Ser. No. 10/230,327; U.S. patent application Ser. No. 09/943,190; U.S. patent application Ser. No. 10/622,482; U.S. patent application Ser. No. 10/081,594; U.S. patent application Ser. No. 10/819,315; U.S. patent application Ser. No. 11/062,436; U.S. patent application Ser. No. 10/899,010; and U.S. patent application Ser. No. 10/796,000, which are incorporated herein by reference.

A second electrode 150 is formed over the stack 130. The second electrode 150 is, for example tungsten, but other conductive materials can be used. Although the layers 131, 132, 133 of stack 130 and second electrode 150 are shown as blanket layers, they could instead be patterned as desired. For example, one or more layers of the stack 130 and/or the second electrode 150 can be patterned as described in copending U.S. patent application Ser. No. 11/111,836, assigned to Micron Technology, Inc., which is incorporated herein by reference.

The access transistor 110 enables a true cross point architecture for the array 100. Accordingly, the array 100 can have a $4F^2$ structure and provides a more efficient use of the substrate 101 surface area.

The formation the memory array 100 (FIGS. 2A-2C) according to an exemplary embodiment of the invention is now described in connection with FIGS. 3A-3J. No particular order is required for any of the actions described herein, except for those logically requiring the results of prior actions. Accordingly, while the actions below are described as being performed in a general order, the order is exemplary only and can be altered if desired. Although the formation of only a portion of an array 100 is described, it should be appreciated that the memory array 100 can include additional memory elements 135 and access transistors 110, which can be formed concurrently.

Figure 3A:
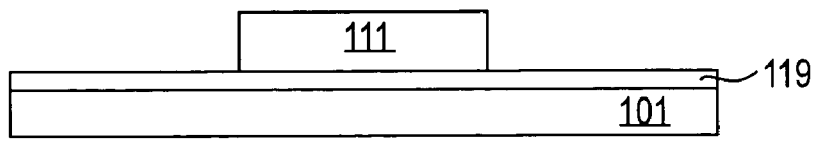
FIGS. 3A-3J depict the formation of the memory elements of FIGS. 2A-2C at different stages of processing.

As shown by FIG. 3A, a substrate 101 is initially provided. As indicated above, the substrate 101 can be semiconductor-based or another material useful as a supporting structure. A first dielectric region 119 is formed over the substrate 101. The first dielectric region 119 can be one or more layers of dielectric material, such as silicon nitride, a low dielectric constant material, or other insulators known in the art. The first dielectric region 119 can be formed by any known method. A digit line 111 is formed over the first dielectric region 119. The digit line 111 can be formed by depositing and patterning a conductive material, such as tungsten or other conductive material.

Figure 3B:
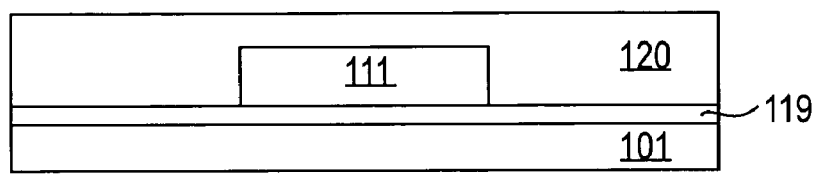

Referring to FIG. 3B, a second dielectric region 120 is formed over the first dielectric region 119 and the digit line 111. The second dielectric region 120 can be one or more layers of dielectric material (such as silicon nitride, a low dielectric constant material, or other insulators known in the art) and can be formed by any known method.

Figure 3C:
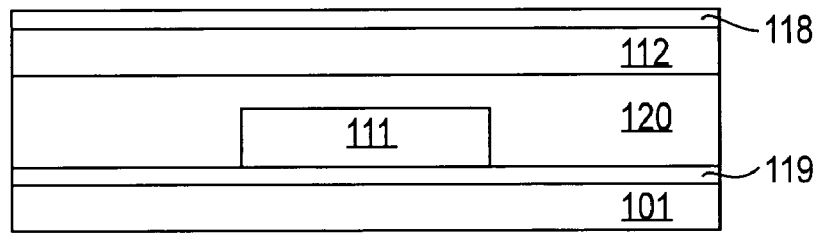

As shown in FIG. 3C, a conductive layer 112 is formed over the second dielectric region 120. An optional insulating layer 118 is formed over the conductive material. If desired, the insulating layer 118 may be omitted. The conductive layer 112 and insulating layer 118 are patterned to form a word line 112 having an insulating layer 118. In the illustrated embodiment, the word line 112 is tungsten and the insulating layer 118 is a nitride, but other conductive and insulating materials can be used.

Figure 3D:
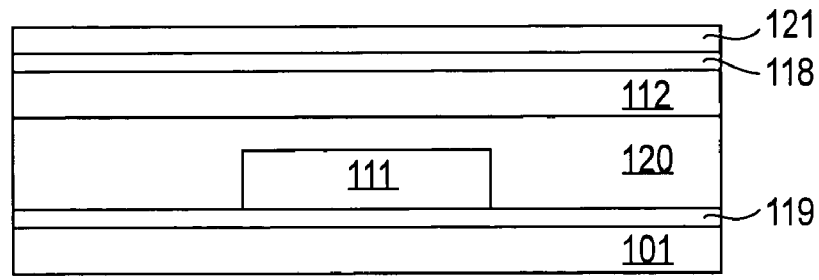

Referring to FIG. 3D, a third dielectric region 121 is formed over the word line 112 and insulating layer 118. The third dielectric region 121 can be one or more layers of dielectric material (such as silicon nitride, a low dielectric constant material, or other insulators known in the art) and can be formed by any known method. In the illustrated embodiment, the third dielectric region 121 includes an uppermost layer of nitride.

Figure 3E:
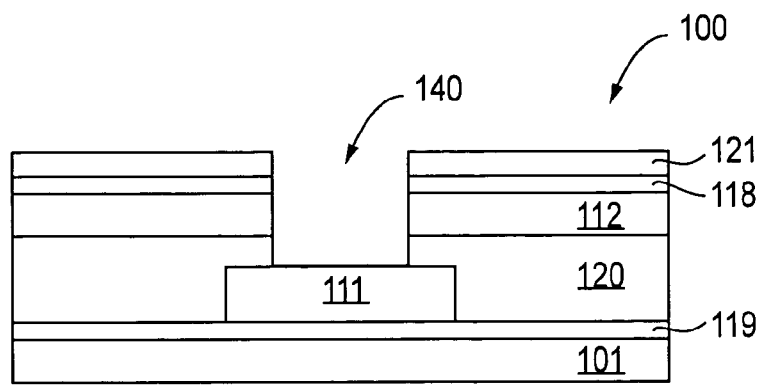

As depicted in FIG. 3E, a via 140 is formed through the third dielectric region 121, insulating layer 118, word line 112, and second dielectric region 120 to expose the surface of the digit line 111. The via 140 is formed at an intersection of the word line 112 and digit line 111. As shown in FIGS. 2B and 2C, the via 140 can be formed such that it is surrounded by word line 112 (FIG. 2B) or positioned at a lateral edge of the word line 112 (FIG. 2C).

Figure 3F:
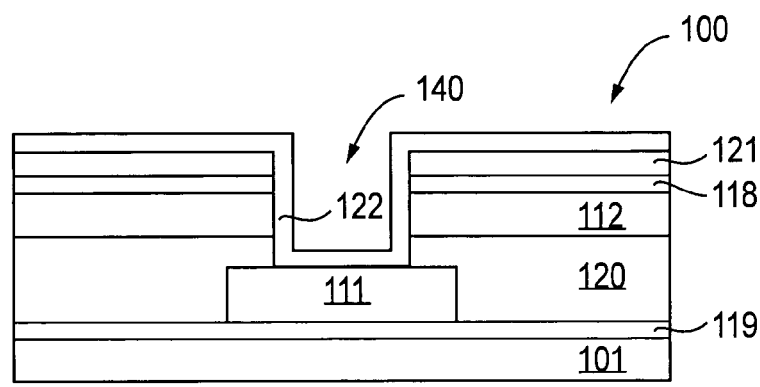
Figure 3G:
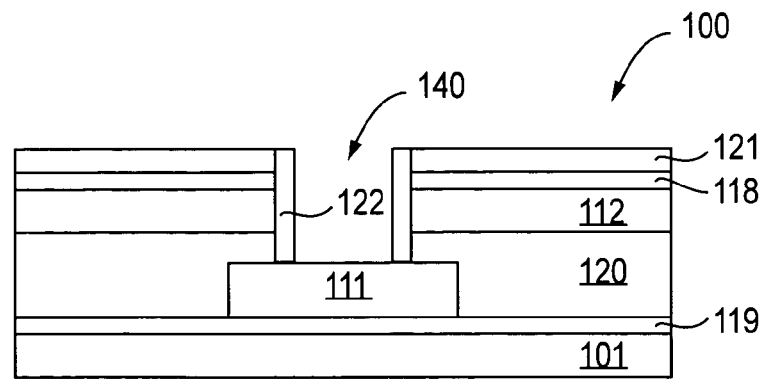

An oxide layer 122 is formed over the third dielectric region 121 and within the via 140 as shown in FIG. 3F. The oxide layer 122 lines the sidewalls of the via 140. An etch step is performed to remove the oxide layer 122 from the bottom of the via 140 and the surface of the third dielectric region 140, as shown in FIG. 3G.

Figure 3H:
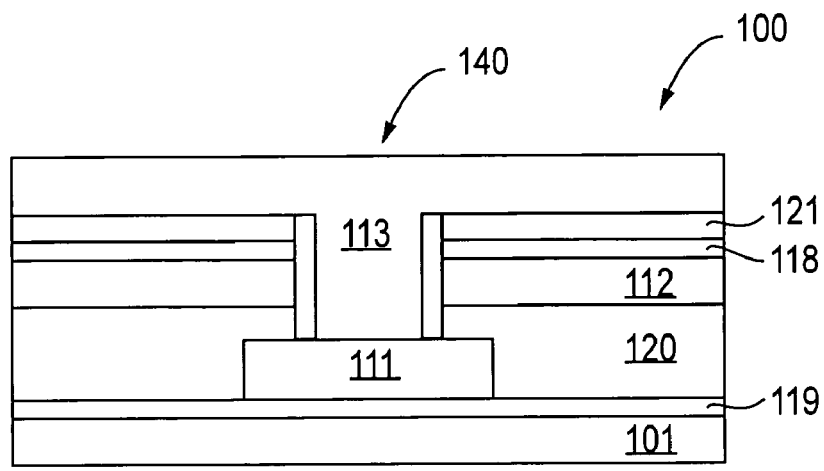

As illustrated in FIG. 3H, a semi-conductive material 113 is deposited over the third dielectric region 121 and fills the via 140. In the illustrated embodiment, the semi-conductive material 113 is tin selenide, but other conductive materials, for example, tin telluride, among others, can be used.

Figure 3I:
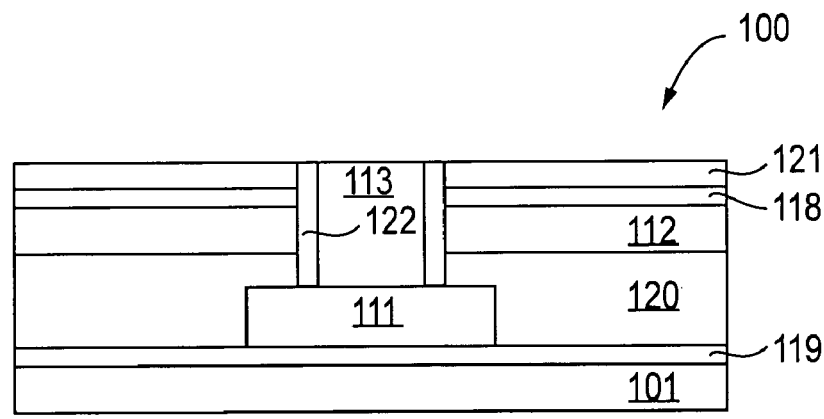

The tin selenide 113 outside the via 140 is removed, as shown in FIG. 3I. For this, a chemical mechanical polish (CMP) step is performed. As is known in the art, the CMP can be stopped upon reaching the upper nitride layer of the third dielectric region 121. Alternatively, a mask layer (not shown) can be formed having a negative image of the via 140. An etch process could then be used to remove the tin selenide 113 unprotected by the mask. As a further alternative, a blanket dry etch step can be performed, leaving the via 140 at least partially filled with tin selenide 113.

Figure 3J:
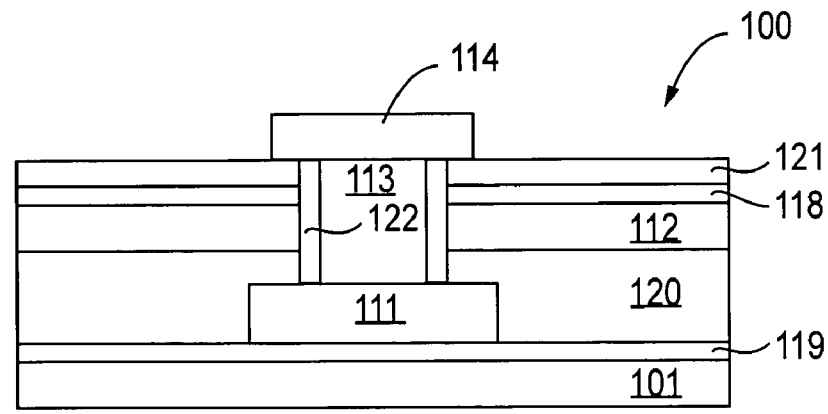

As shown in FIG. 3J, the formation of the access transistor is completed by forming a conductive cap 114 over the via 140 and in contact with the tin selenide 113. For this, a conductive layer is formed over the third dielectric region 121 and via 140. The conductive layer is patterned to form approximately a negative image of the via 140. In the illustrated embodiment, the conductive cap 114 is tungsten, but other conductive materials can be used.

Memory elements 135 can be formed in contact with the conductive cap 114. For example, at least one layer of a memory stack 130 is formed over the second insulating region 121 and capping layer 114 to achieve the structure shown in FIG. 2A.

In the illustrated embodiment, a chalcogenide material layer 131 is formed over the capping layer 114 and third insulating region 121. Formation of the chalcogenide material layer 131 may be accomplished by any suitable method, for example, by sputtering. Additional layers of the memory stack 130 are formed over the layer 131. In the illustrated embodiment, an optional metal-chalcogenide layer 132 (e.g., tin-chalcogenide) is formed over and in contact with the chalcogenide material layer 131. The metal-chalcogenide layer 132 can be formed by any suitable method, e.g., physical vapor deposition, chemical vapor deposition, co-evaporation, sputtering, among other techniques. An optional metal layer 133 is formed over the tin-chalcogenide layer 132. The metal layer 133 is preferably silver (Ag), or at contains silver, and is formed to a preferred thickness of about 300 Å to about 500 Å. The metal layer 133 may be deposited by any technique known in the art. Also, a second electrode layer 150 is deposited over the stack 130. Although the layers 131, 132, 133 of the stack 130 and the second electrode layer 150 are shown as blanket layers, one or more of these layers can be patterned as desired.

Figure 4:
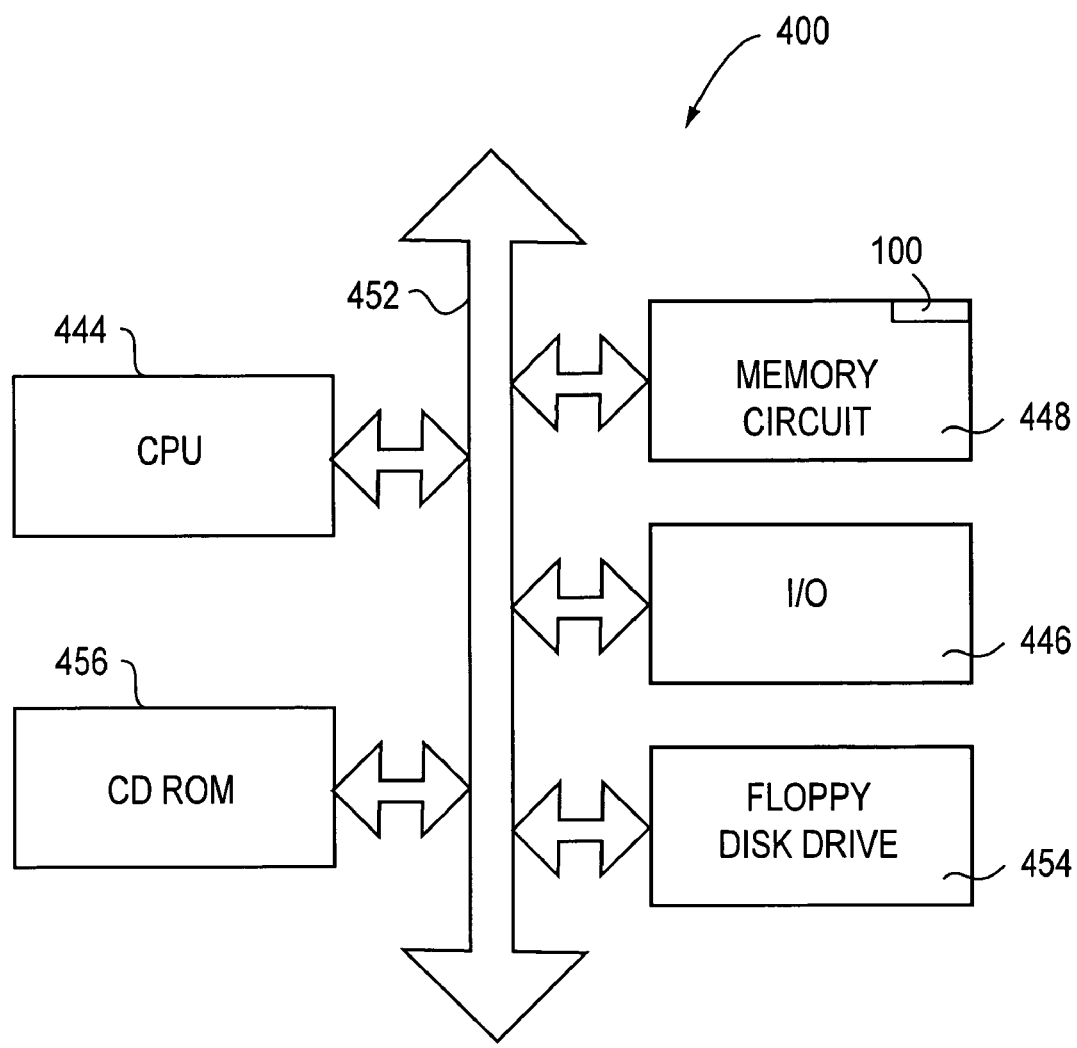
FIG. 4 is a block diagram of a system including a memory element according to an exemplary embodiment of the invention.

FIG. 4 illustrates a processor system 400 which includes a memory circuit 448, e.g., a memory device, which employs memory array 100 constructed according to the invention. The processor system 400, which can be, for example, a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452 typically through a memory controller.

In the case of a computer system, the processor system 400 may include peripheral devices such as a floppy disk drive 454 and a compact disc (CD) ROM drive 456, which also communicate with CPU 444 over the bus 452. Memory circuit 448 is preferably constructed as an integrated circuit, which includes a memory array 100 according to the invention. If desired, the memory circuit 448 may be combined with the processor, for example CPU 444, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

The invention claimed is:

1. A memory array comprising:
   a substrate;
   a plurality of access transistors over the substrate, each access transistor comprising a channel region between first and second electrodes, the channel region, first electrode and second electrode being vertically stacked over the substrate, the channel region being in contact with a top surface of the first electrode and completely isolated from the substrate by the first electrode; and
   a resistance variable material and a first portion of metal-chalcogenide material over and electrically coupled to a plurality of second electrodes of respective access transistors and forming a plurality of resistance variable memory elements, each accessed by the respective access transistor, wherein the channel region comprises a second portion of the metal-chalcogenide material.

2. The array of claim 1, wherein the access transistor further comprises a gate, and wherein the gate is a conductive line.

3. The array of claim 2, wherein the channel region comprises a semi-conductive material extending through the conductive line and being in contact with the first electrode.

4. The array of claim 3, wherein the second electrode is an electrode for the at least one memory element.

5. The array of claim 3, wherein the semi-conductive material is laterally surrounded by the conductive line.

6. The array of claim 3, wherein the semi-conductive material is only partially laterally surrounded by the conductive line.

7. The array of claim 1, wherein the channel region comprises a semi-conductive material within a via.

8. The array of claim 7, wherein sidewalls of the via are lined with an insulating layer.

9. The memory array of claim 1, wherein the resistance variable material is in contact with at least a portion of the second electrode of each respective access transistor.

10. A processor system, the system comprising:
    a processor; and
    a memory device coupled to the processor, the memory device comprising a memory array, the memory array comprising:
    a plurality of transistors, each transistor comprising a channel region between first and second source/drain regions, the channel region, first source/drain region and second source/drain region being vertically stacked over the substrate, the first source/drain region being a first conductive line, the conductive line being completely isolated from a substrate by a dielectric region, the channel region being in contact with a top surface of the first conductive line, and
    a plurality of blanket layers stacked over and electrically coupled to a plurality of second source/drain regions of respective transistors and forming a plurality of memory elements,
    each accessed by the respective transistor, the plurality of layers comprising a resistance variable material and a metal-chalcogenide material, wherein the channel region comprises the metal-chalcogenide material.

11. The system of claim 10, wherein the access transistor further comprises a gate and the gate is a second conductive line.

12. The system of claim 11, and wherein the channel region comprises a semi-conductive material extending through the second conductive line and is in contact with the first conductive line, and wherein the second source/drain region is a conductive layer in contact with the channel region.

13. The system of claim 12, wherein the conductive layer is the first electrode.

* * * * *

UNITED STATES PATENT AND TRADEMARK OFFICE
CERTIFICATE OF CORRECTION

PATENT NO. : 7,579,615 B2
APPLICATION NO. : 11/199251
DATED : August 25, 2009
INVENTOR(S) : Jon Daley et al.

Page 1 of 1

It is certified that error appears in the above-identified patent and that said Letters Patent is hereby corrected as shown below:

In column 8, lines 29-32, in Claim 10, delete "each accessed by the respective transistor, the plurality of layers comprising a resistance variable material and a metal-chalcogenide material, wherein the channel region comprises the metal-chalcogenide material." and insert the same on col. 8, claim 10, line 28, after "elements," as a continuation of the same line.

Signed and Sealed this

Twentieth Day of October, 2009

David J. Kappos
*Director of the United States Patent and Trademark Office*